(12) United States Patent
Chow-Yee et al.

(10) Patent No.: US 12,395,793 B2
(45) Date of Patent: Aug. 19, 2025

(54) INTEGRATED INTERCONNECT FOR A BACK-FIRING MICROPHONE CIRCUIT BOARD

(71) Applicant: Google LLC, Mountain View, CA (US)

(72) Inventors: Kliulai Chow-Yee, Mountain View, CA (US); Yu-chuan Lin, Chicago, IL (US); WARren Jones, Mountain View, CA (US); Josh Alexander, Mountain View, CA (US)

(73) Assignee: Google LLC, Mountain View, CA (US)

( * ) Notice: Subject to any disclaimer, the term of this patent is extended or adjusted under 35 U.S.C. 154(b) by 179 days.

(21) Appl. No.: 18/082,399

(22) Filed: Dec. 15, 2022

(65) Prior Publication Data

US 2024/0205599 A1 Jun. 20, 2024

(51) Int. Cl.
| | |
|---|---|
| H04R 3/00 | (2006.01) |
| H04R 1/04 | (2006.01) |
| H04R 3/04 | (2006.01) |
| H05K 1/14 | (2006.01) |
| H05K 1/18 | (2006.01) |

(52) U.S. Cl.
CPC ............. *H04R 3/04* (2013.01); *H04R 1/04* (2013.01); *H05K 1/145* (2013.01); *H05K 1/181* (2013.01); *H05K 1/189* (2013.01); *H04R 2499/11* (2013.01); *H05K 2201/10083* (2013.01); *H05K 2201/10378* (2013.01)

(58) Field of Classification Search
CPC ......... H04R 3/04; H04R 1/04; H04R 2499/11
USPC ...... 379/265.01–265.14, 266.01–266.1, 309; 381/92, 95, 96, 97, 98
See application file for complete search history.

(56) References Cited

U.S. PATENT DOCUMENTS

| | | | |
|---|---|---|---|
| 2008/0283988 A1* | 11/2008 | Huang | B81B 7/0061 257/E23.18 |
| 2012/0099264 A1* | 4/2012 | Degner | G06F 1/1658 361/679.09 |
| 2012/0275621 A1 | 11/2012 | Elko | |
| 2013/0329450 A1* | 12/2013 | Degner | G06F 1/1616 361/679.55 |
| 2014/0079269 A1* | 3/2014 | Choi | H04R 1/342 381/365 |
| 2016/0366767 A1 | 12/2016 | Ye | |
| 2017/0094436 A1 | 3/2017 | Sheplak et al. | |
| 2017/0111720 A1* | 4/2017 | Miehl | H04R 1/086 |
| 2018/0314304 A1* | 11/2018 | Degner | F16B 41/005 |

FOREIGN PATENT DOCUMENTS

WO 2000076183 12/2000

* cited by examiner

*Primary Examiner* — William J Deane, Jr.
(74) *Attorney, Agent, or Firm* — IP Spring

(57) ABSTRACT

A circuit board assembly includes a top circuit board forming a microphone aperture and carrying electrical conductors. The circuit board assembly further includes a back-firing microphone connected to the top circuit board, the circuit board assembly providing support for the microphone, and the microphone electrically connected to the electrical conductors. The circuit board assembly further includes at least one interposer connected to the circuit board assembly, the at least one interposer positioned to the side of the back-firing microphone and including vias for providing a pathway for electrical connection to the top circuit board conductors.

14 Claims, 6 Drawing Sheets

INTEGRATED INTERCONNECT FOR A BACK-FIRING MICROPHONE CIRCUIT BOARD

BACKGROUND

A microphone mounted to a circuit board may be a top-firing microphone or a back-firing microphone. Top-firing and bottom-firing microphones each have advantages and disadvantages, but back-firing microphones, which are more challenging to accommodate mounting, have an acoustic advantage over top-firing microphones and are often selected for use in mobile devices such as smartphones, tablets, laptops, home speakers, and other products.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In some embodiments, a circuit board assembly comprises a top circuit board forming a microphone aperture and carrying electrical conductors. The circuit board assembly further includes a back-firing microphone connected to the top circuit board, the circuit board assembly providing support for the microphone, and the microphone electrically connected to the electrical conductors. The circuit board assembly further includes at least one interposer connected to the circuit board assembly, the at least one interposer positioned to a side of the back-firing microphone and including vias for providing a pathway for electrical connection to the top circuit board conductors.

In some embodiments, the circuit board assembly further including a bottom circuit board, the bottom circuit board forming an opening for the microphone, the at least one interposer physically connecting the top and bottom circuit boards and providing multiple electrical connections. In some embodiments, the top circuit board includes a stainless-steel stiffener, a charge transfer sense amplifier, and a flexible board. In some embodiments, the top circuit board is a flexible circuit board. In some embodiments, the top circuit board is a rigid board. In some embodiments, the circuit board assembly further includes a bottom circuit board, the bottom circuit board supporting other components and including electrical conductors, the vias providing an electrical connection between the top circuit board conductors and the bottom circuit board conductors. In some embodiments, the at least one interposer is an interposer extending at least partially around the microphone. In some embodiments, the at least one interposer includes two or more interposers, the interposers positioned on different sides of the microphone.

In some embodiments, the bottom circuit board is a two-layer flex with a stack that includes a first layer of copper, a second layer of polyimide, and a third layer of copper, wherein the second layer of polyimide is in between the first layer and the third layer. In some embodiments, the at least one interposer includes at least one interposer with four or more vias. In some embodiments, the at least one interposer includes at least one interposer with five vias that are arranged in a sawtooth pattern. In some embodiments, the circuit board assembly further comprises filtering and electrical components connected to top circuit board. In some embodiments, the bottom board is a two-layer flex with a stack that includes a first layer of copper, a second layer of polyimide, and a third layer of copper, wherein the second layer of polyimide is in between the first layer and the third layer. In some embodiments, the bottom board includes traces, a width of the traces is 50 µm, and a space between the traces is about 75 µm.

The specification advantageously identifies a back-firing microphone design that optimizes for x- and y-real estate, while taking advantage of the space in z-space rather than growing the circuit board. Additionally, the technology relies on the attachment strength of soldering to hold the separate board in place, rather than a small surface area of a pressure sensitive adhesive, which can have reliability concerns. Lastly, the increased surface area provides more support for wetting out a separate mesh part for ingress protection and acoustic performance.

DETAILED DESCRIPTION

Figure 1:
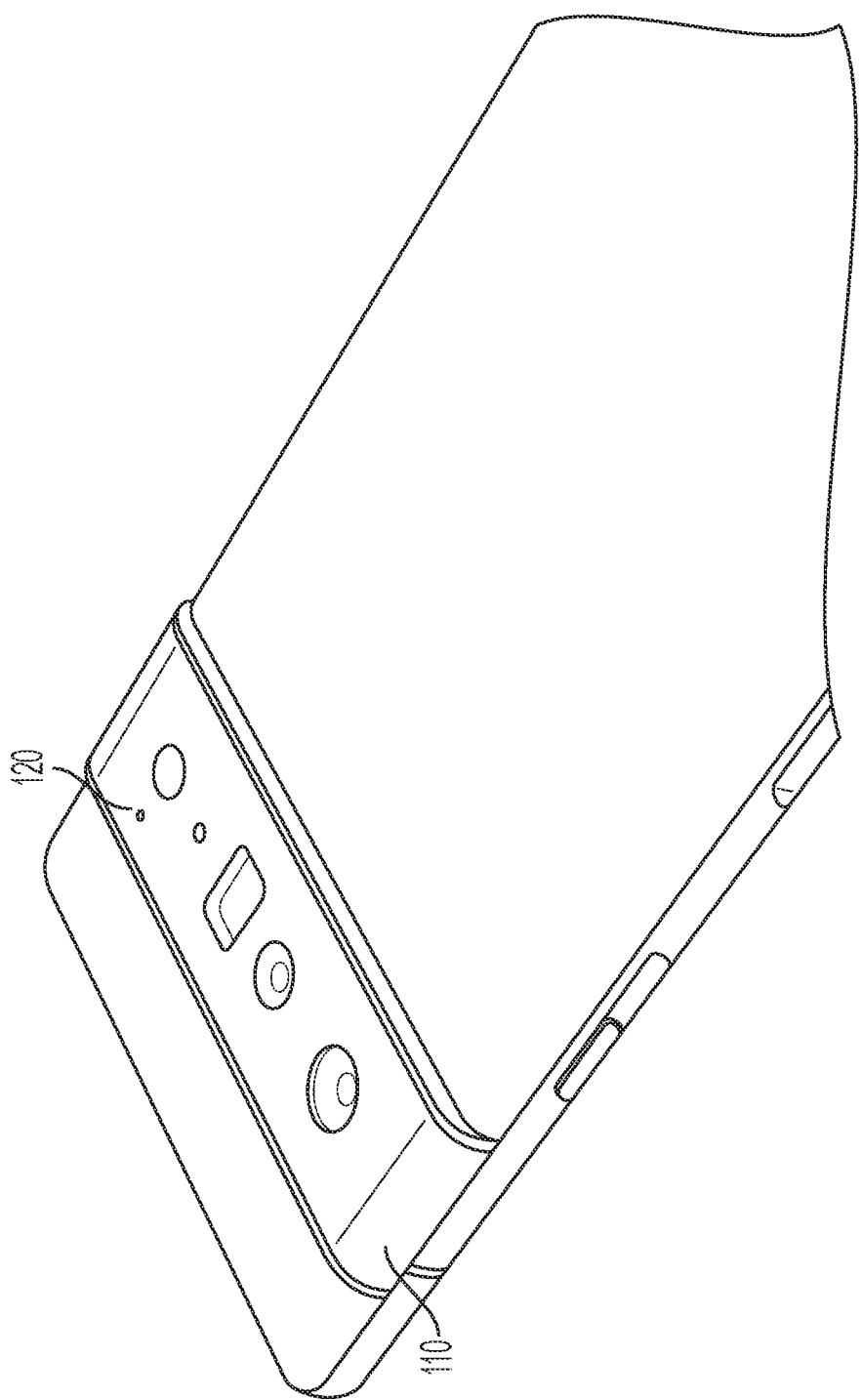
FIG. 1 illustrates a perspective view of an example mobile device, according to some embodiments described herein.

FIG. 1 a perspective view of an example mobile device 100. A mobile device 100 may include one or more microphone ports. In this example, the mobile device 100 includes a visor 110 that includes one example of a microphone port 120. The microphone port 120 may be located on any part of the visor 110 as well as any part of the mobile device 100.

Figure 2:
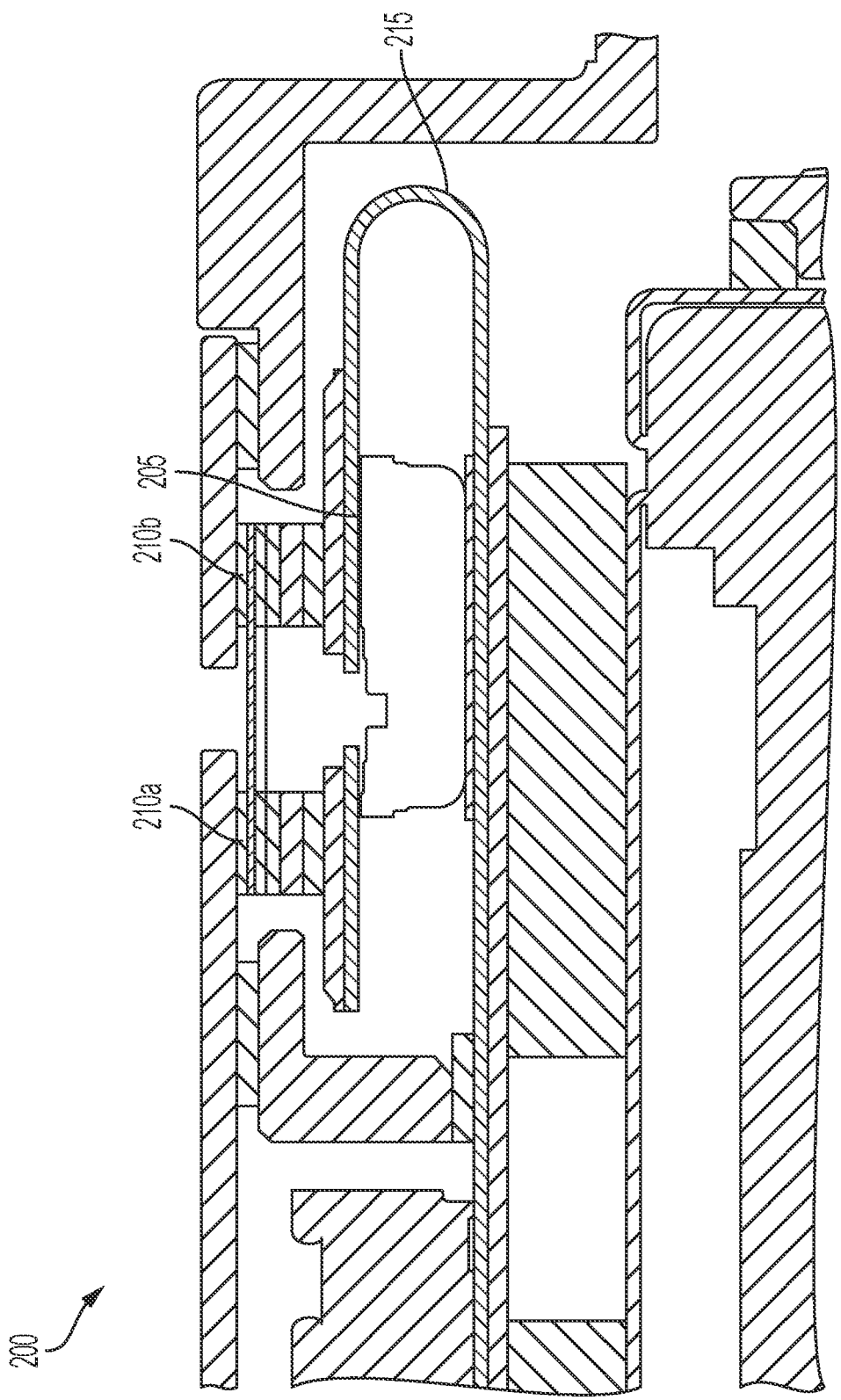
FIG. 2 is a diagram illustrating an example prior art circuit board.

The surface area on circuit boards for a microphone may be limited in different devices. Furthermore, the back-firing microphone can only be assembled on a specific side of the circuit board. FIG. 2 illustrates a diagram 200 of an example prior art circuit board. The circuit board includes a back-firing microphone 205 that is below two interposers 210a, 210b, and held in place with a flex tail 215 with a 280-degree bend (seen on the right-hand side of the figure). The flex tail 215 artificially increases x- and y-real estate while ensuring that the back-firing microphone is placed in the correct orientation. The flex tail 215 is kept in place with adhesive. When exposed to high temperature and/or high humidity, the adhesive as well as the tension in the 180-degree bend can fail, e.g., can delaminate.

Figure 3A:
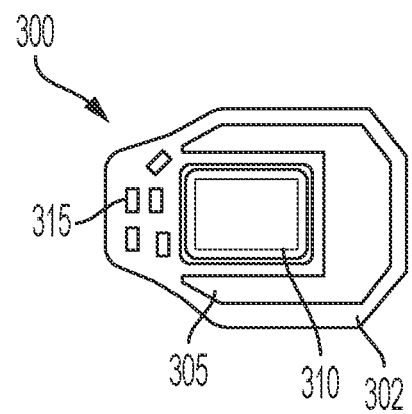
FIGS. 3A-3C are diagrams of an example circuit board assembly with a back-firing microphone, according to some embodiments described herein.
Figure 3B:
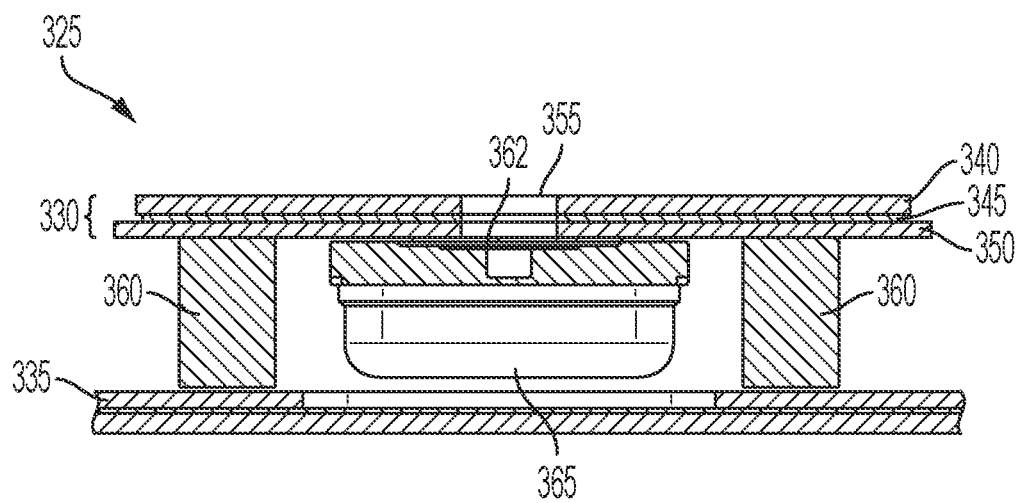
Figure 3C:
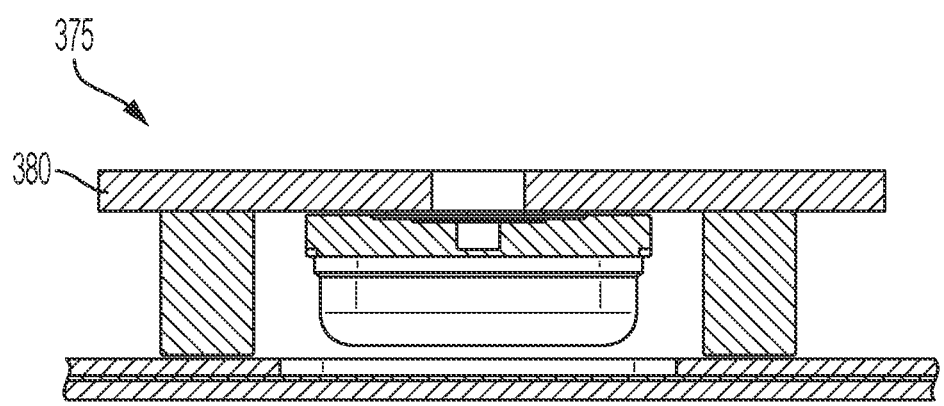

FIG. 3A-3C are diagrams of an example circuit board assembly with a back-firing microphone.

FIG. 3A illustrates a plan view of a circuit board assembly 300. The circuit board assembly 300 includes a circuit board 302. For example, circuit board 302 may be a printed circuit board. In some embodiments, circuit board 302 is a flexible circuit board. The circuit board assembly 300 further includes an interposer 305, a microphone 310, and filtering and electrical components 315. In some embodiments, the electrical components 315 may be omitted.

In this example, as seen in FIG. 3A, the interposer 305 is a single U-shaped component that surrounds (partially circumscribes) the microphone 310. The interposer 305 is a physical support that includes conductors for routing signals between the circuit board 302 and other circuitry not carried on circuit board 302. The interposer provides the mechanical standoff between the circuit board 302 and an adjacent connected board. The interposer may be formed from a printed circuit board stock cut to the desired shape. In some embodiments, the single interposer 305 is preferable to using multiple interposers because the single interposer 305 is more stable and includes less variation during soldering than would occur if multiple interposers are used. In some embodiments, the width of the interposer 305 is between 5 and 6 mm and the height is between 3.5 and 5 mm, the width between the portion of the interposer 305 on the right side of the microphone 310 is between 1 and 2 mm, and the height of the portions of the interposer 305 that are above and below the microphone 310 in FIG. 3A are between 1 and 2 mm.

The electrical components 315 provide filtering and electrical bypassing for signals. In this embodiment, the electrical components 315 are grouped together such that the interposer 305 and the microphone 310 set the size of the microphone assembly by being allocated for most of the lateral space on the circuit board 302.

FIG. 3B is a diagram illustrating side view of a microphone assembly 325 for a flexible circuit board according to some embodiments. The microphone assembly 325 includes a top board 330 and a bottom board 335.

The top board 330 includes a flexible board (e.g., a mini-flex) that is composed of a stainless-steel stiffener 340 (which in some embodiments is about 0.15 mm), a charge transfer sense amplifier 345 that in some embodiments is about 0.04 mm thick, and a flex substance 350 that in some embodiments is about 0.12 mm thick. The stiffener 340 functions as a mechanical support but may also provide heat dissipation. The stiffener 340 may be bonded on one or two sides with adhesive, polyethylene, or pressure sensitive adhesive tape. The charge transfer sense amplifier 345 enables the electric audio signals generated by the back-firing microphone 365 to be transmitted to a processor (not illustrated).

The top board 330 forms a microphone aperture 355. Although the microphone aperture 355 is illustrated as having the same aperture width for each of the three levels of the top board 330, different widths are possible.

In some embodiments, the top board 330 includes an acoustic mesh (not illustrated) that provides water sealing and protection against foreign objects entering the microphone aperture 355. The stainless-steel stiffener 340 in the top board 330 is a rigid material that allows compression of the acoustic mesh.

In between the top board 330 and the bottom board 335 are an interposer 360 and a back-firing microphone 365. In some embodiments, the interposer 360 may be soldered onto (or otherwise mounted on) the top board 330. The interposer 360 is illustrated from the side, and can be a single interposer, like interposer 305 in FIG. 3A, or multiple interposers on different (or opposite) sides of the back-firing microphone 365, like the interposers illustrated in FIGS. 4A-4C. The back-firing microphone 365 includes a hole 362 for reception of audio, the hole aligned with the microphone aperture 355. In some embodiments, the interposer has a height of approximately 1 mm. Signals are routed through the interposer 360. The back-firing microphone 365 may be connected to an application-specific integrated circuit (ASIC) or other suitable processor (not illustrated).

The back-firing microphone 365 is mounted onto one surface of the top board 330 using surface-mount technology, such as soldering. In some embodiments, the back-firing microphone 365 is radio frequency shielded to isolate the back-firing microphone 365 from electromagnetic interference. In some embodiments, a cover (not shown) that surrounds the back-firing microphone 365 shields the back-firing microphone 365 from electromagnetic interferences.

In some embodiments, the bottom board 335 is a flexible board. In some embodiments, the bottom board 332 includes a two-layer flexible board with a copper/polyimide/copper stack where the thickness of the layers is about 10.8 μm/25 μm/10.8 μm. The bottom board 335 forms a cutout for the back-firing microphone 365 that is discussed in greater detail below.

The bottom board 335 is designed with a layout that prevents electrostatic discharge. The signal traces, power traces, and ground traces are separated by a non-conductive material, such as a dielectric polymer (not illustrated). The bottom board 335 includes traces that are each formed by a thin conductive foil patterned onto a dielectric substrate. Each trace is patterned onto the dielectric substrate in a designed circuit pattern using, for example, photolithography and etching techniques. The conductive foil may be copper, although other conductive materials may be used. In some embodiments, the width of the traces is about 50 μm and the space between the traces is about 75 μm.

The bottom board 335 also includes vias, which are interconnecting nodes between different layers of the circuit board. The area between a hole drilled into a via and an edge of the conductive copper pad is referred to as an annular ring. In some embodiments, the diameter of the hole in the bottom board 335 is 100 μm and the diameter of the annular ring in the bottom board 335 is 300 μm.

In some embodiments, the top board 330 and the bottom board 335 are both flexible boards. For example, the top board 330 and the bottom board 335 can be panelized in parallel to reduce the cost and complexity of producing the flexible circuit board.

FIG. 3C is a diagram illustrating printed circuit board 375 according to some embodiments. The printed circuit board 375 includes a rigid board for a top board 380 instead of the mini flex that is part of a flexible circuit board because the printed circuit board 375 is a less flexible embodiment. The top board 380 may be a 0.3 millimeter (mm) thick rigid board.

Figure 4A:
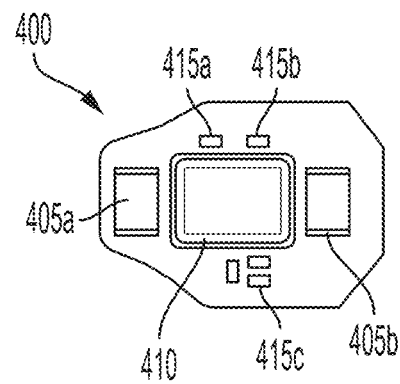
FIG. 4A-4C are diagrams of another example of a circuit board assembly with a back-firing microphone, according to some embodiments described herein.

FIG. 4A illustrates a plan view of a flexible circuit board or a printed circuit board. The circuit board 400 includes interposers 405a, 405b, a microphone 410, and filtering and electrical components 415a, b, c. In FIG. 4 and the other figures, a letter after a reference number, e.g., "405a," represents a reference to the element having that particular reference number. A reference number in the text without a following letter, e.g., "405," represents a general reference to embodiments of the element bearing that reference number.

In this example, the filtering and electrical components 415 are grouped as filtering and electrical components 415a, b on one side of the microphone 410 and filtering and electrical components 415c on the other side of the microphone 410. Because the interposers 405 take up less surface area than in the embodiment illustrated in FIG. 3A, a greater number of configurations of the filtering and electrical components 415 is possible.

Figure 4B:
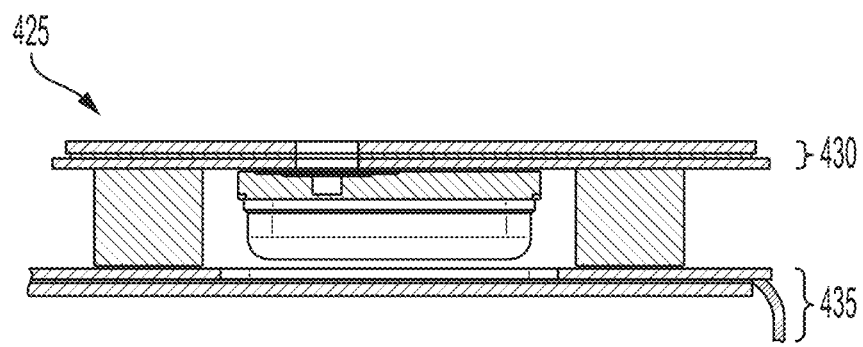

FIG. 4B is a diagram illustrating side view of a printed circuit board 425 according to some embodiments. The printed circuit board 425 is designed with a top board 430 and a bottom board 435.

Figure 4C:
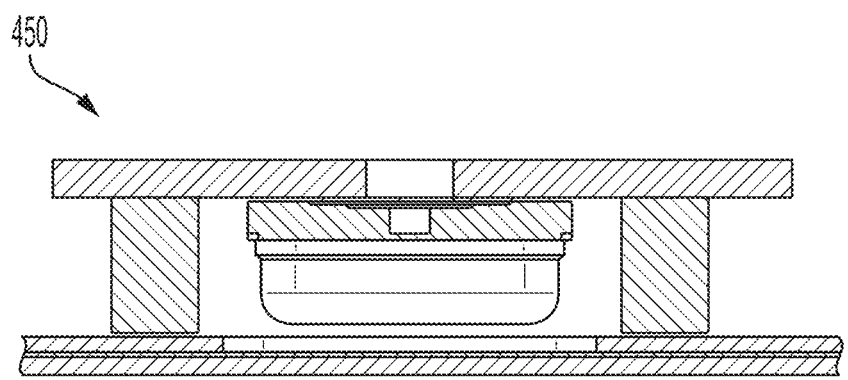

FIG. 4C is a diagram illustrating a printed circuit board 450 according to some embodiments.

FIGS. 5A-5D are diagrams of the bottom board, the top board, and the interposers.

Figure 5B:
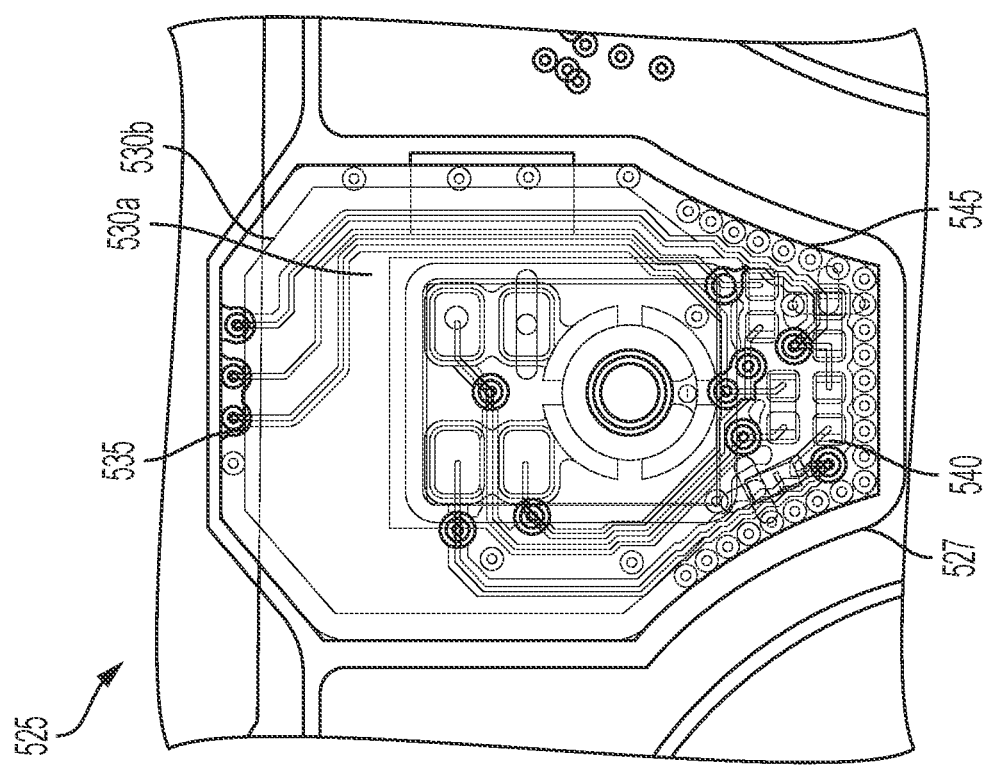
FIGS. 5A-5D are diagrams of the bottom board, the top board, and interposers, according to some embodiments described herein.
Figure 5A:
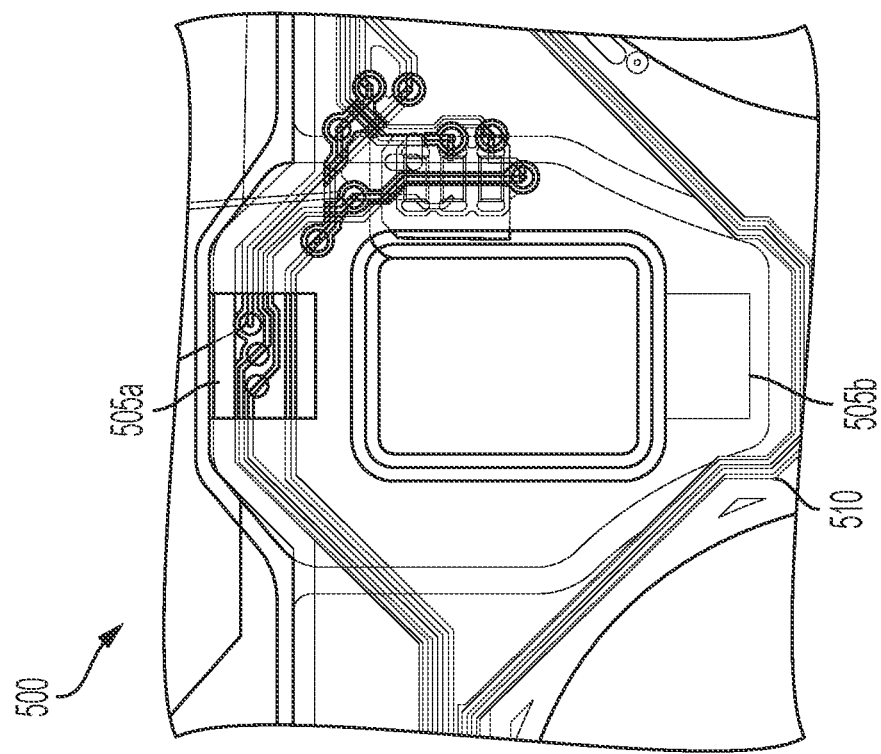

FIG. 5A illustrates a plan view of a bottom board 500, according to some embodiments. The bottom board 500 is a flexible board that forms a cutout in the center of the bottom board 500 for the microphone. In this example, the bottom board 500 sits on top of two interposers 505*a*, 505*b*. In some embodiments, the two interposers 505*a*, 505*b* may be a single interposer as illustrated in FIGS. 3A-3C. The bottom board 500 also includes conductive lines to carry speaker and microphone signals 510.

FIG. 5B illustrates a plan view of the top board 525, according to some embodiments. In FIG. 5B, a board outline 527, an outline of the interposer 530*a, b*, an example of conductive lines for a signal 535 that is routed through the interposer, an example of conductive lines to carry discrete signal 540 for the microphone, and the stiffener 545 are illustrated.

The top board 525 includes copper layers to create a ground shield for preventing electrostatic discharge on the microphone porting hole sides of the top board 525 to reduce the risk of damage as compared to the flex-tail design illustrated in the prior art assembly of FIG. 2.

Figure 5C:
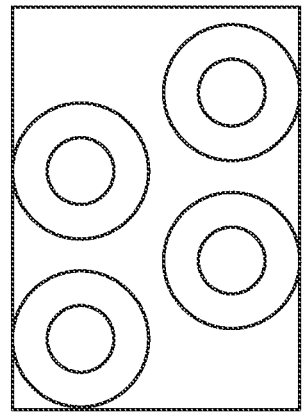

FIG. 5C is a diagram illustrating a middle standoff first interposer 550, according to some embodiments. The interposer 550 may be a two-layer rigid board with four, five, or more vias for connectivity for signals that provide power, a clock, data, and one or two ground signals. In some embodiments, a microphone needs at least four signal connections to function. In some embodiments, a single interposer model needs at least four vias, but would likely have many more to provide better mechanical strength and signal redundancy.

In this example, FIG. 5C illustrates five vias where the fifth via may provide redundancy for either the power, clock, data, or ground signals, and three mechanical vias that do not provide electrical connection, but add to the strength of the overall solder joints between the interposer 550 and boards. In some embodiments, the first interposer 550 may have a thickness of 1.07 mm with a minimum x/y of 1.6 mm/1.25 mm. In some embodiments, the diameter of the hole in the via in the first interposer 550 may be 0.25 mm and the diameter of the of the annular ring may be 0.1 mm as illustrated in FIG. 5C. The distance between the centers of the vias may be 0.35 mm for the eight vias illustrated in FIG. 5C.

Figure 5D:
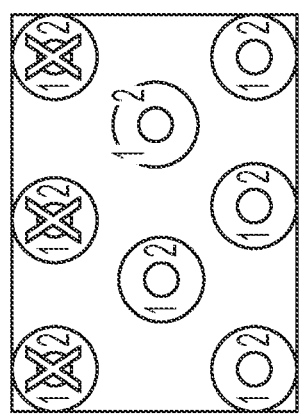

FIG. 5D is a diagram illustrating a middle standoff second interposer 575, according to some embodiments. The diameter of the hole of the via in the second interposer 575 is illustrated as 0.2 mm and the diameter of the annular ring of the via in the second interposer 575 is illustrated as 0.4 mm. The distance between the centers of the vias may be 0.5 mm for the four vias as illustrated in FIG. 5D. In some embodiments, through hole type vias are not used for mobile phones because they may be too large to fit, but if they are used the cost of producing a printed circuit board may be cheaper than otherwise.

In some embodiments, the vias may be organized as a sawtooth pattern such as shown in FIG. 5D. Extra mechanical vias may be added to the board edge to create greater mechanical strength. In some embodiments, the size of the interposer 550, 575 may be achieved using a high-density interconnect circuit board where the annular ring is between about 0.1 mm to 0.25 mm.

FIG. 5C and FIG. 5D show two alternative via layouts with the same sized layout outline, but with different vias. FIG. 5D uses a larger "through hole" type via technology (drill/annular ring of 0.2 mm/0.4 m). It has four vias, which is the minimum number of signal connections the microphone needs to function, but most designs would likely have many more vias to provide better mechanical strength and signal redundancy. FIG. 5C uses smaller "HDI (1+2+1)" type via technology (drill/annular ring of 0.1 mm/0.25 mm). Because there is extra room on this layout, three of the vias on the back row are marked with an "X" to signify that they would be mechanical only and don't provide any electrical connection.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in diagram form in order to avoid obscuring the description. For example, the embodiments can be described above primarily with reference to particular hardware. However, the embodiments can apply to any type of circuit board.

Reference in the specification to "some embodiments" or "some instances" means that a particular feature, structure, or characteristic described in connection with the embodiments or instances can be included in at least one implementation of the description. The appearances of the phrase "in some embodiments" in various places in the specification are not necessarily all referring to the same embodiments.

What is claimed is:

1. A circuit board assembly comprising:
a top circuit board forming a microphone aperture and carrying electrical conductors;
a back-firing microphone connected to the top circuit board, the circuit board assembly providing support for the microphone, and the microphone electrically connected to the electrical conductors, wherein a top of the back-firing microphone is connected to a bottom of the top circuit board; and
at least one interposer connected to the circuit board assembly, the at least one interposer positioned to a side of the back-firing microphone and including vias for providing a pathway for electrical connection to the electrical conductors in the top circuit board.

2. The circuit board assembly of claim 1, the circuit board assembly further including a bottom circuit board, the bottom circuit board forming an opening for the microphone, the at least one interposer physically connecting the top and bottom circuit boards and providing multiple electrical connections.

3. The circuit board assembly of claim 1, wherein the top circuit board includes a stainless-steel stiffener, a charge transfer sense amplifier, and a flexible board.

4. The circuit board assembly of claim 1, wherein the top circuit board is a flexible circuit board.

5. The circuit board assembly of claim 1, wherein the top circuit board is a rigid board.

6. The circuit board assembly of claim 1, further including a bottom circuit board, the bottom circuit board supporting other components and including electrical conductors, the vias providing an electrical connection between the electrical conductors in the top circuit board and the electrical conductors in the bottom circuit board.

7. The circuit board assembly of claim 1, wherein the at least one interposer is an interposer extending at least partially around the microphone.

8. The circuit board assembly of claim 1, wherein the at least one interposer includes two or more interposers, the interposers positioned on different sides of the microphone.

9. The circuit board assembly of claim 2, wherein the bottom circuit board is a two-layer flex with a stack that includes a first layer of copper, a second layer of polyimide, and a third layer of copper, wherein the second layer of polyimide is in between the first layer and the third layer.

10. The circuit board assembly of claim 1, wherein the at least one interposer includes at least one interposer with four or more vias.

11. The circuit board assembly of claim 1, wherein the at least one interposer includes at least one interposer with five vias that are arranged in a sawtooth pattern.

12. The circuit board assembly of claim 1, wherein the circuit board assembly further comprises filtering and electrical components connected to top circuit board.

13. The circuit board assembly of claim 2, wherein the bottom board is a two-layer flex with a stack that includes a first layer of copper, a second layer of polyimide, and a third layer of copper, wherein the second layer of polyimide is in between the first layer and the third layer.

14. The circuit board assembly of claim 13, wherein the bottom board includes traces, a width of the traces is 50 μm, and a space between the traces is about 75 μm.

\* \* \* \* \*